United States Patent [19]

Sasaki

[11] Patent Number: 5,631,930
[45] Date of Patent: May 20, 1997

[54] RADIO TRANSMISSION OUTPUT CONTROL CIRCUIT FOR TDMA COMMUNICATION

[75] Inventor: Yutaka Sasaki, Tokyo, Japan

[73] Assignee: NEC Corporation, Japan

[21] Appl. No.: 512,548

[22] Filed: Aug. 8, 1995

[30] Foreign Application Priority Data

Aug. 8, 1994 [JP] Japan .................................. 6-205984

[51] Int. Cl.$^6$ .............................. H04L 1/02; H04L 25/03; H04L 25/49
[52] U.S. Cl. .............................. 375/296; 375/308; 332/103; 455/126
[58] Field of Search .............................. 375/308, 329, 375/296, 298, 331; 332/123–125, 117, 103; 370/95.1, 95.3; 327/60, 68, 77; 455/126–127

[56] References Cited

U.S. PATENT DOCUMENTS

| | | | |
|---|---|---|---|
| 5,187,809 | 2/1993 | Rich et al. | 370/95.3 |
| 5,193,223 | 3/1993 | Wilson et al. | 455/126 |
| 5,222,104 | 6/1993 | Medendorp | 375/308 |
| 5,387,555 | 2/1995 | Wilson et al. | 455/127 |

FOREIGN PATENT DOCUMENTS

| | | |
|---|---|---|
| 0621685 | 10/1994 | European Pat. Off. . |
| 64-51330 | 3/1989 | Japan . |
| 2267612 | 12/1993 | United Kingdom . |

OTHER PUBLICATIONS

WPI Abstract Accession No. 93–360180/46 & JP 6112849, Apr. 22, 1994.

WPI Abstract Accession No. 91–344061/47 & JP 3230607, Oct. 14, 1991.

*Primary Examiner*—Stephen Chin
*Assistant Examiner*—Don Vo
*Attorney, Agent, or Firm*—Scully, Scott, Murphy & Presser

[57] ABSTRACT

In a radio transmission output control circuit, a modulating circuit modulates signals to be sequentially transmitted in consecutive time slots at predetermined timings. A data generating circuit generates, when one time slot is being transmitted, data meant for another time slot to be transmitted subsequently. The data include output control information for the subsequent time slot, and the deviation of the output level of the subsequent time slot. The data generating circuit outputs the data at a transmission timing assigned to the subsequent time slot. A level control circuit controls the output level of the subsequent time slot on the basis of the data from the data generating circuit. With this configuration, it is possible to execute control over a transmission output signal rapidly.

6 Claims, 8 Drawing Sheets

FIG. 7 / TYPICAL CHARACTERISTICS (Ta = 25°C)

RADIO TRANSMISSION OUTPUT CONTROL CIRCUIT FOR TDMA COMMUNICATION

BACKGROUND OF THE INVENTION

The present invention relates to a radio transmission output control circuit and, more particularly, to a radio transmission output control circuit for controlling the transmission outputs of consecutive time slots in TDMA (Time Division Multiple Access) communication.

A radio transmission output control circuit for the above application is disclosed in, for example, FIG. 1 of Japanese Utility Model Laid-Open Publication No. 64-51330. The control circuit of this document includes a ROM (Read Only Memory) 3 storing transmission output switching signals each being assigned to a particular channel. When a certain channel is selected on a channel set switch 1, one of the switching signals matching the channel is read out of the ROM 3 under the control of a microcomputer 2. The switching signal is applied to an automatic power control circuit 5. The power control circuit 5 automatically controls, based on the switching signal, the transmission output of a power amplifier 6 connected to a transmitter section 4.

Digital communication is predominant in today's communication environments. In addition, modulation for digital communication is, in most cases, implemented by a π/4 shift QPSK (Quadrature Phase-Shift Keying) system. A digital cordless telephone is one of TDMA communication apparatuses using the π/4 shift QPSK system, and is a four-slot multiplex communication TDMA-TDD. However, the problem with this kind of modulation system is that the modulated signal contains an AM (Amplitude Modulation) component. Hence, if the level of the transmission output is varied in the same time slot, a data error occurs. It is, therefore, necessary to control, within a guard time intervening between consecutive time slots, the transmission output and stabilize its level. The guard time available with the digital cordless telephone is as short as about 30 µs. That is, the control over the transmission output and the stabilization of its level must be completed within 30 µs. However, high-speed processing is not achievable without complicating the structure of the radio transmission output control circuit. A complicate structure directly translates into an increase in size and power consumption. This kind of control circuit is, therefore, not applicable to a digital cordless telephone or similar portable apparatus.

SUMMARY OF THE INVENTION

It is, therefore, an object of the present invention to provide a radio transmission output control circuit capable of controlling a transmission output stably while reducing size and power consumption.

In order to achieve the above object, a radio transmission output control circuit of the present invention has a modulating circuit for modulating signals to be sequentially transmitted in consecutive time slots at predetermined timings. A control data generating circuit generates, when one of the time slots is being transmitted, control data for controlling the output of another time slot to be transmitted subsequently, and outputs the control data in response to a transmission timing assigned to the time slot. The control data include output control information meant for the subsequent time slot, and a deviation of output level. A level control circuit controls the output level of the subsequent time slot on the basis of the control data.

The modulating circuit may be implemented by a quadrature modulator for modulating a baseband signal to π/4 shift QPSK signal to be transmitted. The control data generating circuit may comprise a RAM (Random Access Memory), a write-in control circuit, and a digital-to-analog converter (DAC). The write-in control circuit calculates a deviation of the level of the time slot to be transmitted subsequently, writes the control data additionally including the deviation in the RAM, and causes the control data to be read out of the RAM within a guard time immediately preceding the subsequent time slot. The DAC latches the data read out of the RAM and converts, at a transmission timing assigned to the subsequent time slot, the data to analog data and outputs it. On the other hand, the level control circuit may comprise a variable, voltage control attenuator which is driven by a driver amplifier receiving the analog data from the DAC. The variable attenuator controls the output level of the subsequent time slot in such a manner as to cancel the deviation included in the data. The radio transmission output control circuit may further include an output level detector for detecting the output level of the time slot output from the attenuator, and for delivering the result of detection to the write-in control circuit.

As stated above, in accordance with the present invention, control data meant for the next time slot and including a deviation and control information is generated while the transmission of the previous time slot is under way. Then, the level of the transmission output is controlled in response to an output timing assigned to the next time slot. Therefore, such a sequence does not have to be completed rapidly in a short period of time. This successfully implements stable transmission output control while reducing the size and power consumption of a transmission output control circuit. When the circuit of the present invention is applied to a digital cordless telephone or similar portable apparatus, it is capable of controlling its transmission output and transmission output level stably without increasing the size or power consumption.

BRIEF DESCRIPTION OF THE DRAWINGS

The above and other objects, features and advantages of the present invention will become apparent from the following detailed description when taken with the accompanying drawings in which.

DETAILED DESCRIPTION OF THE PREFERRED EMBODIMENT

Figure 1:
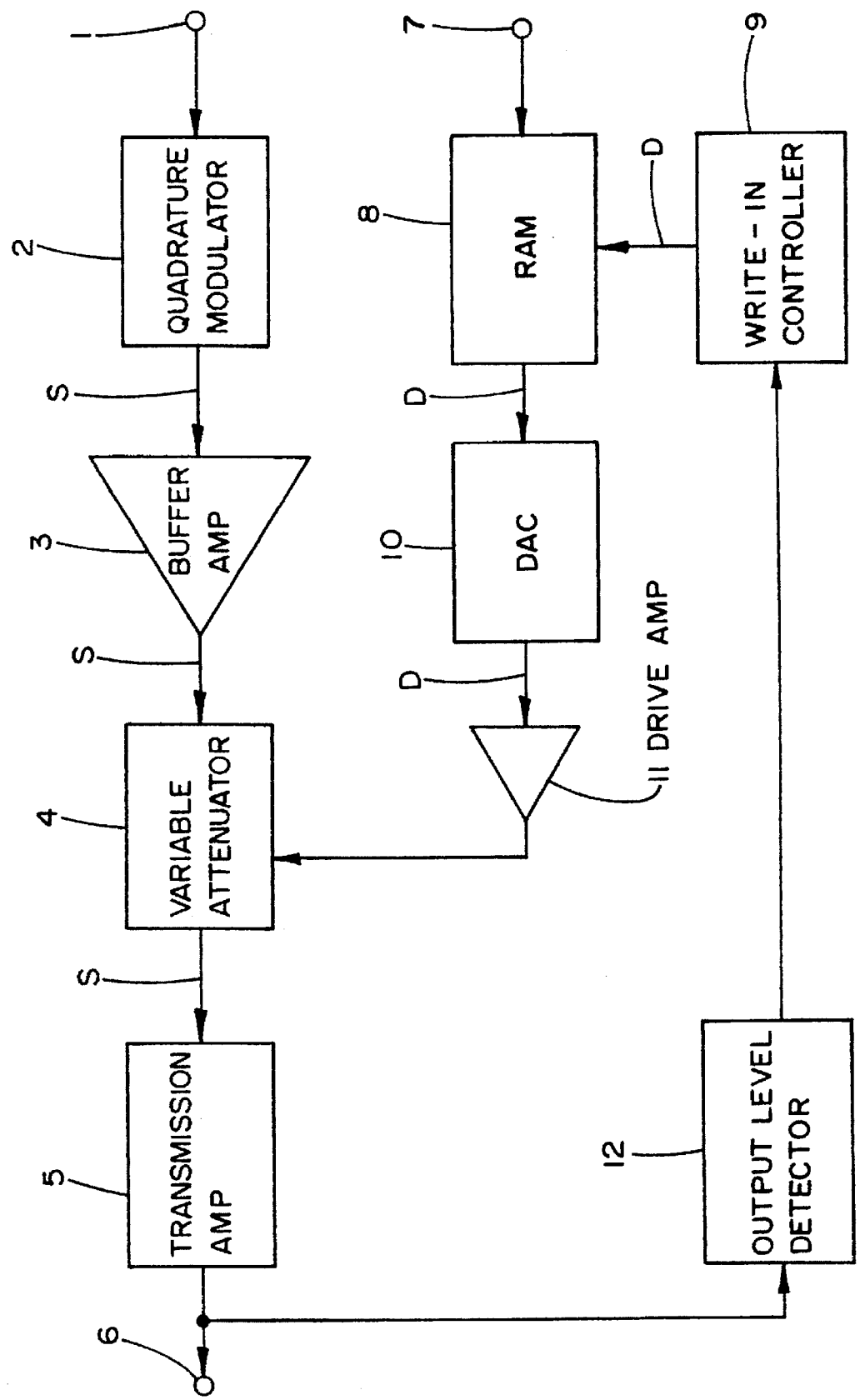
FIG. 1 is a block diagram schematically showing a radio transmission output control circuit embodying the present invention.

Referring to FIG. 1 of the drawings, a radio transmission output control circuit for TDMA communication and embodying the present invention is shown. As shown, a baseband signal input terminal 1 is connected to the input of a quadrature modulator 2. The quadrature modulator 2 modulates a baseband signal coming in through the input terminal 1 to a π/4 shift QPSK signal S to be transmitted. The output of the modulator 2 is connected to a variable, voltage control attenuator 4 via a buffer amplifier (AMP) 3. The variable attenuator 4 controls the level of voltage of the input signal S. The output of the attenuator 4 is connected to an output terminal 6 via an transmission amplifier (AMP) 5 for transmission. The signal S amplified by the amplifier 5 is sent via the output terminal 6 as a radio wave.

As also shown in FIG. 1, a timing signal input terminal 7 is connected to a RAM 8. The RAM 8 outputs, based on a transmission timing signal from the input terminal 7, control data D for controlling the attenuator 4, as will be described specifically later. An output level detector 12 detects the actual levels of consecutive time slots for transmission and delivers them to a write-in controller 9. The write-in controller 9 sequentially generates, in response to the detected levels from the detector 12, control data D meant for the consecutive time slots while writing them in the RAM 8.

Figure 3:
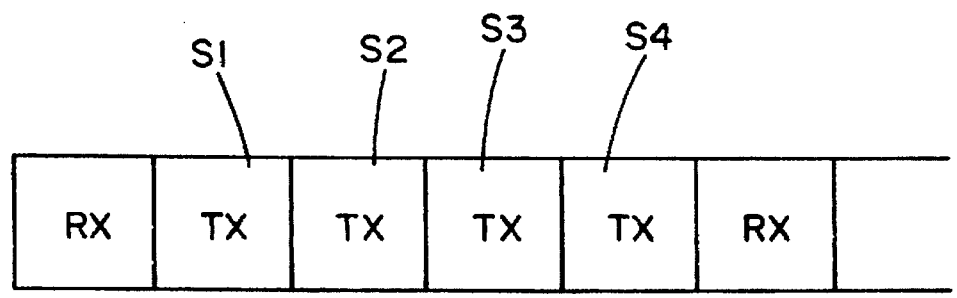
FIG. 3 shows time slots specifically.
Figure 5:
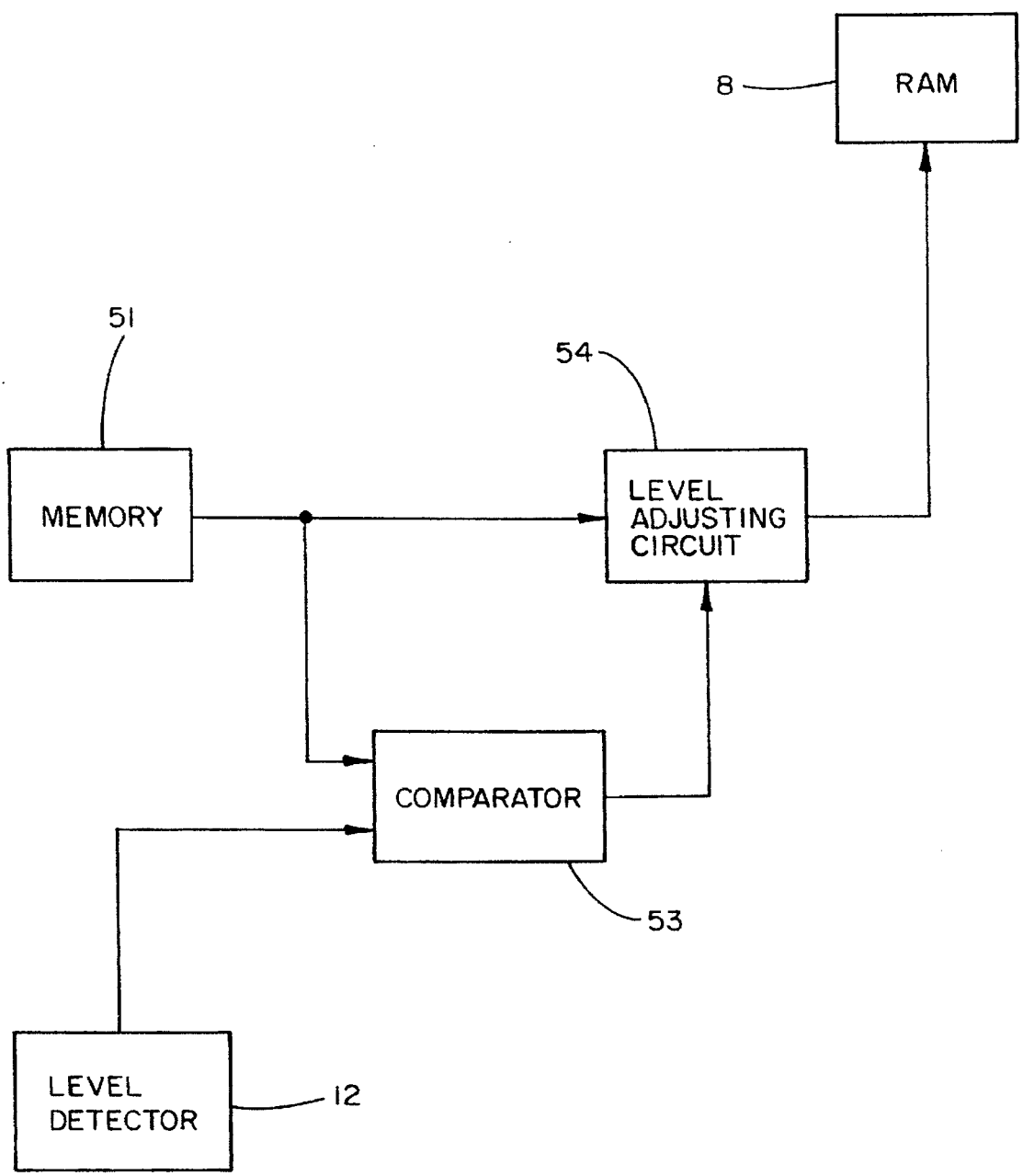
FIG. 5 is a block diagram schematically showing a specific construction of a write-in controller circuit also included in the embodiment.

Specifically, FIG. 3 shows four consecutive time slots S1, S2, S3 and S4 for transmission (TX). Labeled RX are time slots for reception. Assume that the write-in controller 9 controls the output level of the second time slot S2 by way of example. First, the controller 9 calculates, while the transmission of the first time slot S1 is under way, a difference between the actual transmission level of the second slot S2 sent last time and the preselected level of the time slot S2 to be sent. Then, the controller 9 corrects control data D on the basis of the above difference or deviation. As shown in FIG. 5 specifically, the controller 9 is made up of a memory 51, a comparator 53, and a level adjusting circuit 54. The memory 51 stores values preselected such that a particular transmission level is output for each time slot. The comparator 53 compares a transmission level actually detected by the level detector 12 in each time slot and the corresponding preselected value. The level adjusting circuit 54 corrects the preselected value on the basis of the output of the comparator 53, i.e., by adding ±Δ to the preselected value. For example, when the actual transmission level is higher than a desired level, the circuit 54 changes the preselected value such that the transmission level of the time slot to be sent next is lowered by Δ. Conversely, when the former is lower than the latter, the circuit 54 increases the preselected value by Δ. If the corrected value is still higher than the desired value, the circuit 54 again adjusts the corrected value such that the transmission level is lowered by another Δ (2Δ in total). The above control is executed for every time slot.

Referring again to FIG. 1, the control data D written to the RAM 8 is read out, under the control of the controller 9, within a guard time immediately before a timing signal meant for a time slot to be sent next is input to the input terminal 7. The output of the RAM 8 is connected to a digital-to-analog converter (DAC) 10. The DAC 10 latches the control data D fed from the RAM 8. When a timing signal meant for the next time slot is input to the input terminal 7, the DAC 10 converts the control data D to analog control data D and then outputs it. The output of the DAC 10 is connected to a driver amplifier (AMP) 11. The driver amplifier 11 drives the variable attenuator 4 in response to the analog control data D from the DAC 10. Specifically, in response to the control data D from the DAC 10, the attenuator 4 controls the amount of attenuation of the signal S fed thereto from the buffer amplifier 3.

Figure 2:
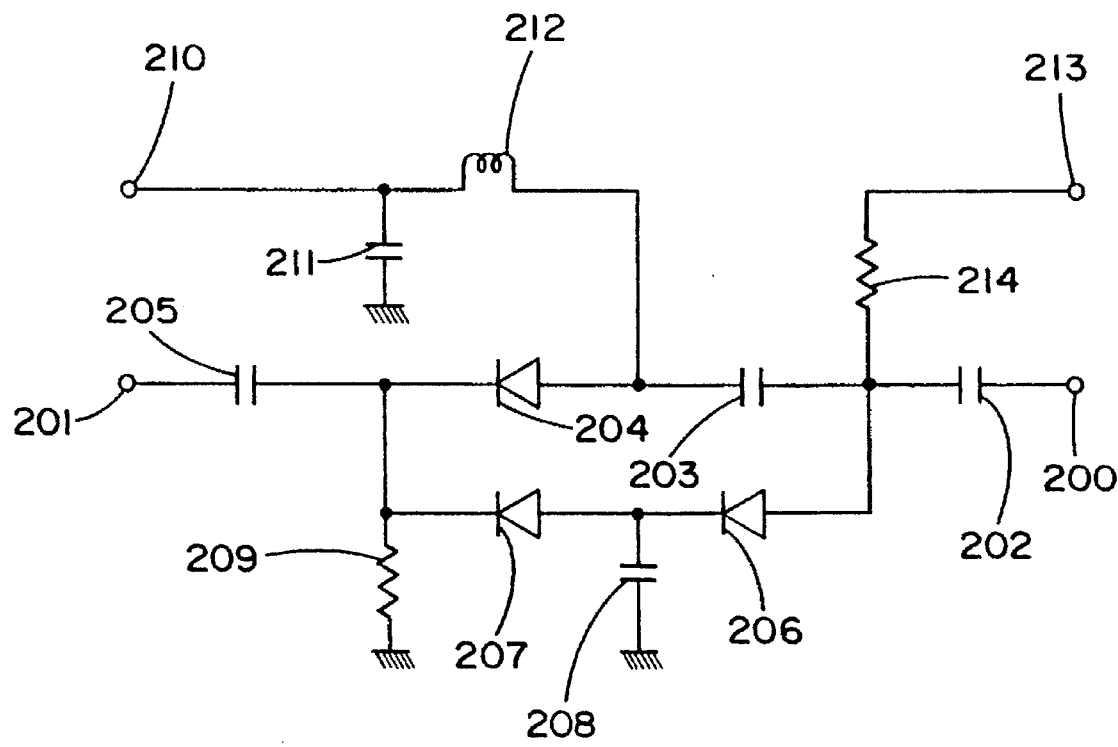
FIG. 2 is a circuit diagram showing a specific construction of a variable, voltage control attenuator included in the embodiment.

FIG. 2 shows a specific circuit arrangement of the variable attenuator 4. As shown, the attenuator 4 has an input 200 connected to the output of the buffer amplifier 3, and an output 201 connected to the input of the amplifier 5. Capacitors 202 and 203, a pin diode 204, and a capacitor 205 are serially connected between the input 200 and the output 201. Pin diodes 206 and 207 are connected in parallel to the capacitor 203 and pin diode 204. A capacitor 208 is connected to ground at one end and to between the pin diodes 206 and 207 at the other end. A resistor 209 is connected to ground at one end and to the output of the pin diode 207 at the other end.

Figure 7:
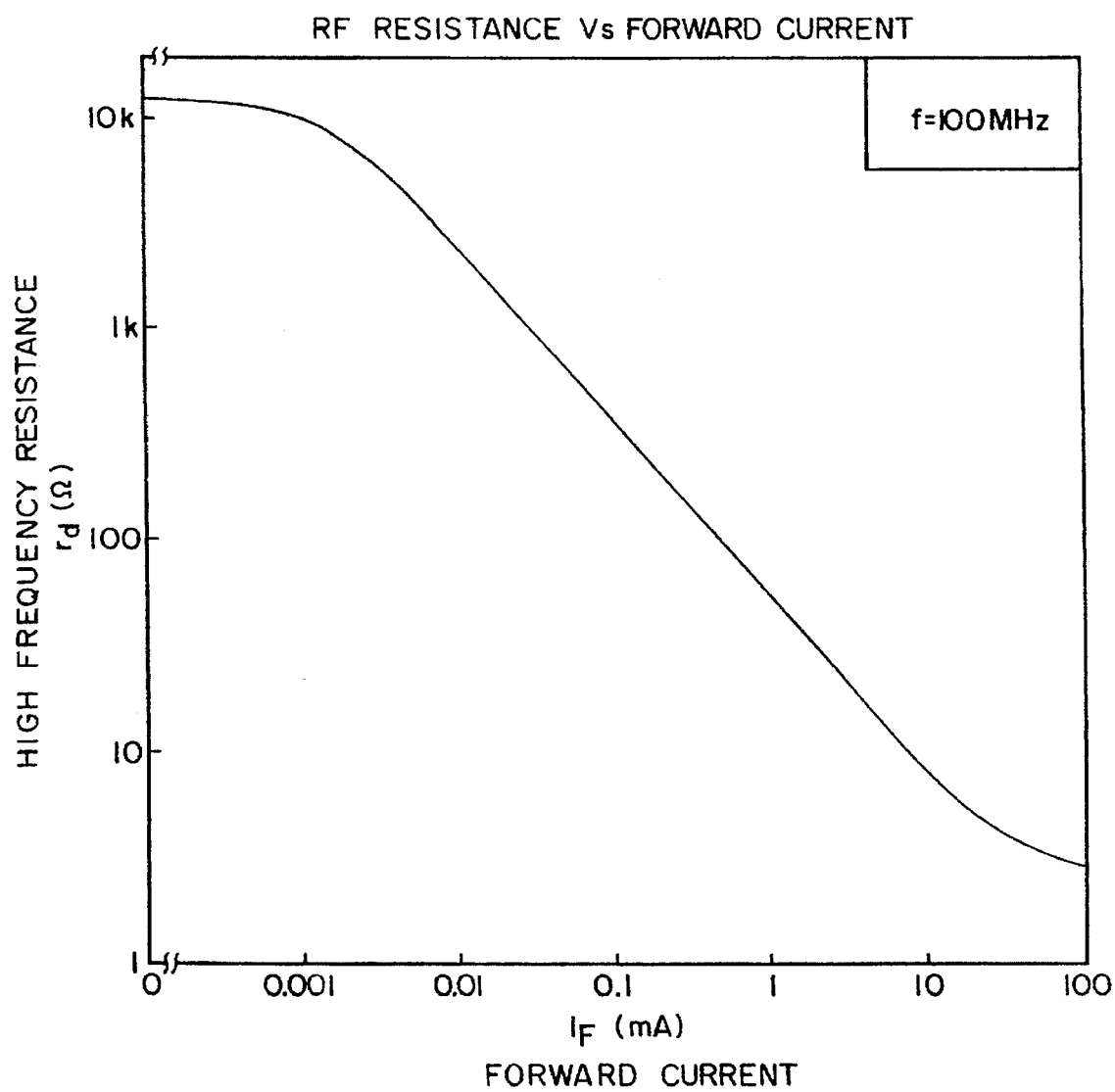
FIG. 7 shows the electrical characteristic of a pin diode.
Figure 8:
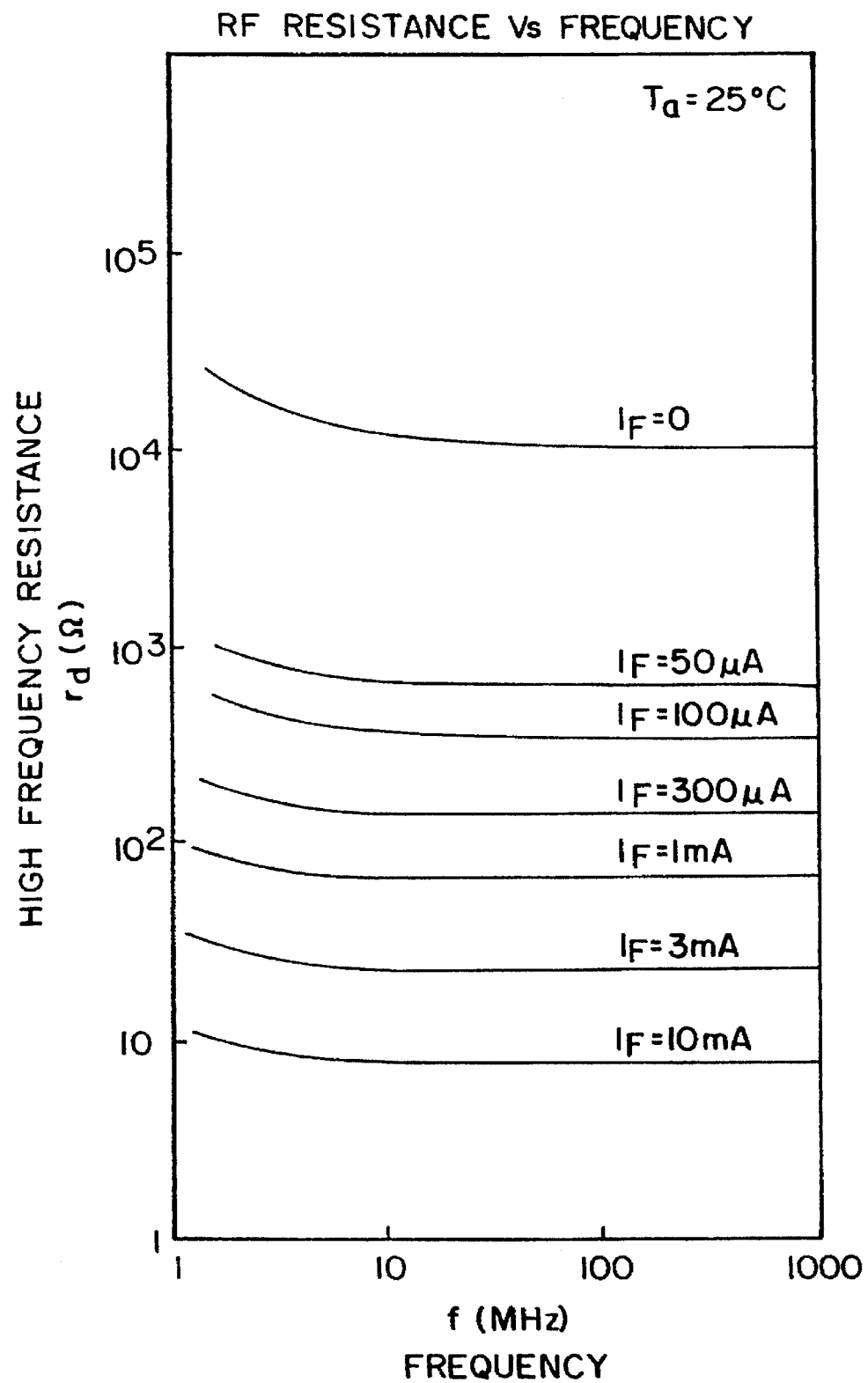
FIG. 8 shows a specific variation in the high frequency resistance of a pin diode with respect to frequency.

FIG. 7 shows the general electrical characteristic of a pin diode. As shown, when a forward current flows through the diode, a high frequency resistance rd decreases. The resistance rd increases with a decrease in the current. FIG. 8 indicates a relation between the resistance rd and the frequency by using the forward current as a parameter. On the other hand, π type constant impedance attenuator implemented by a fixed resistance has a resistance and attenuation varying as shown in FIG. 9, as well known in the art.

Figure 6:
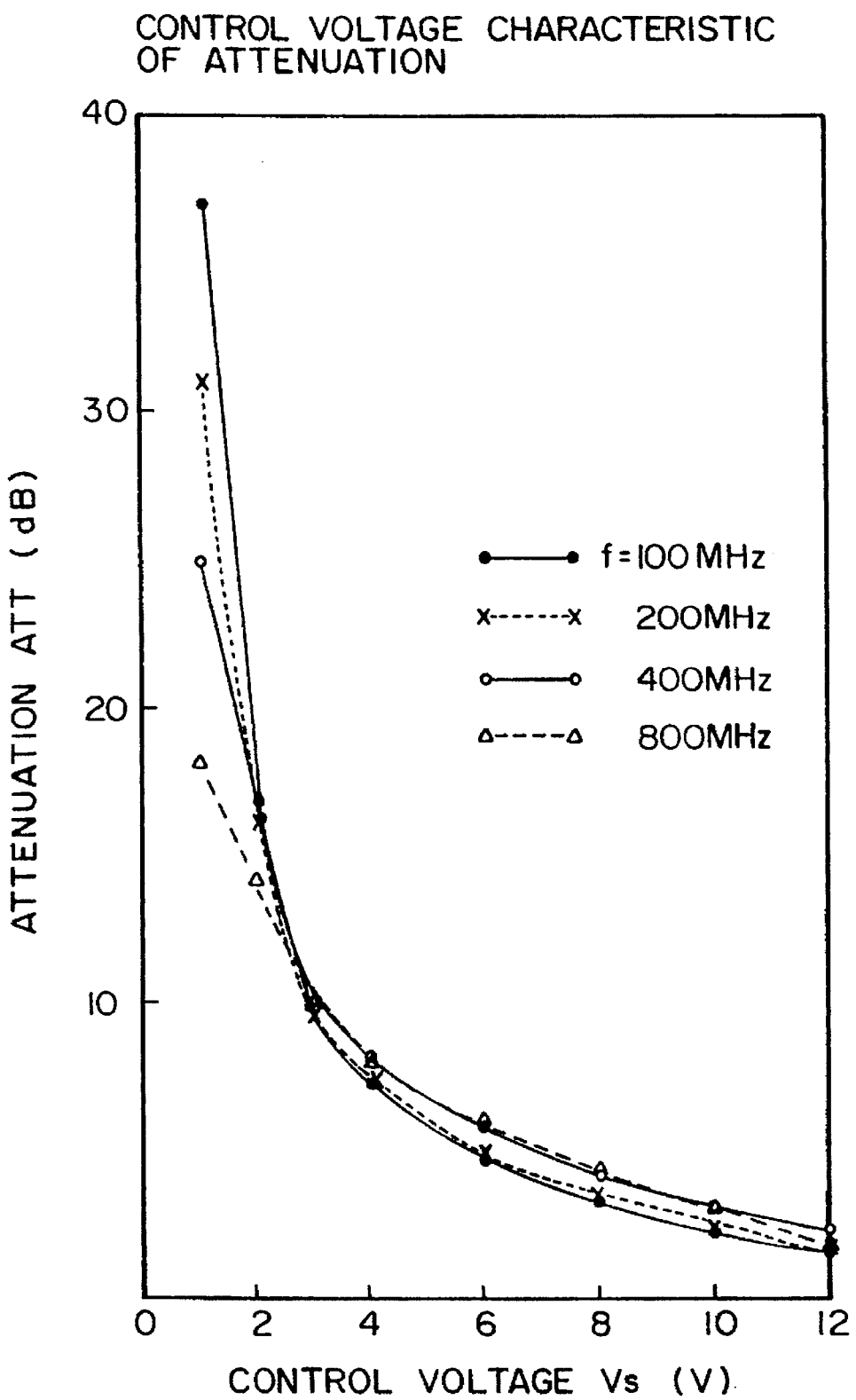
FIG. 6 shows a relation between the control voltage and the amount of attenuation to be effected by a variable attenuator.
Figure 9:
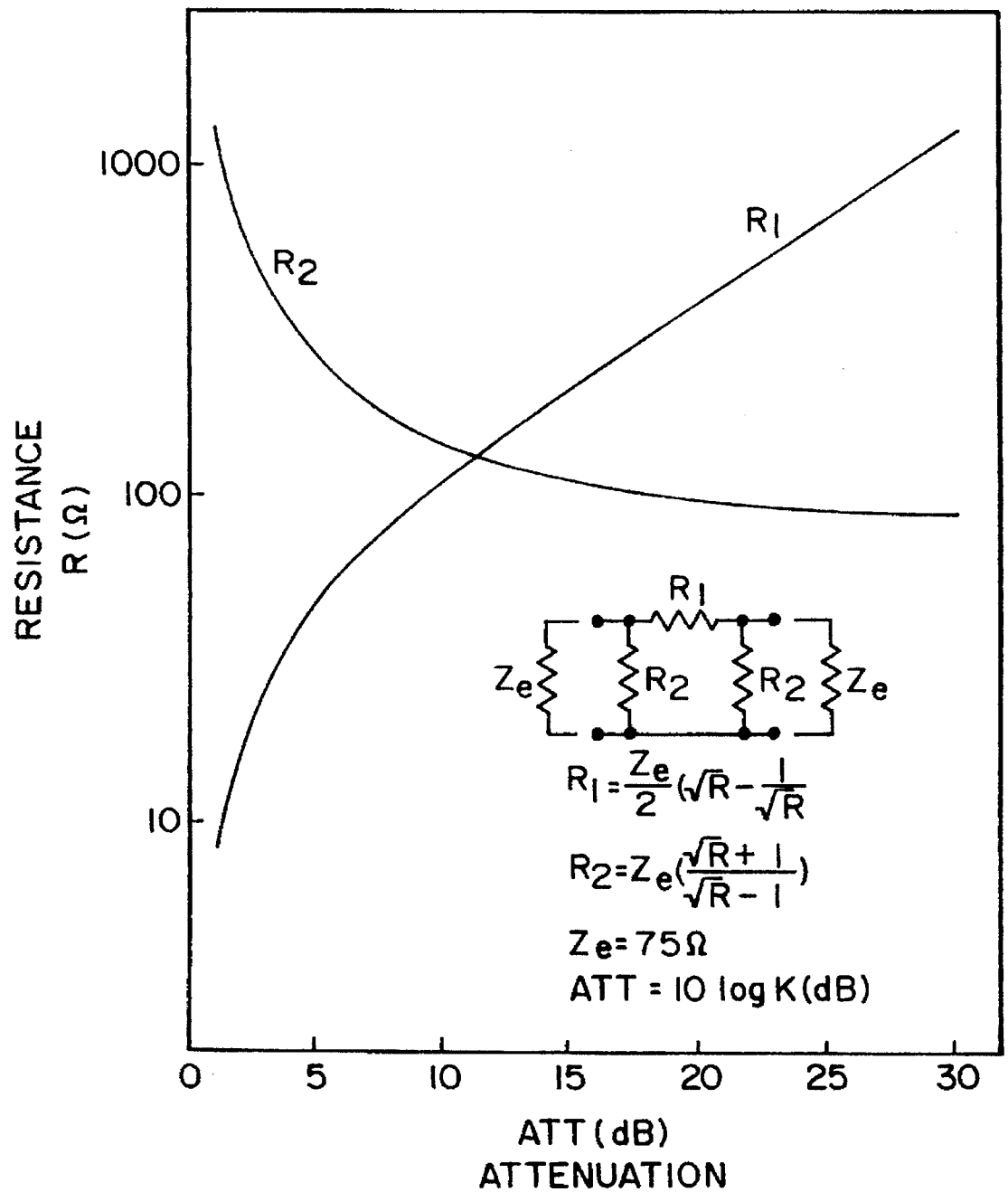
FIG. 9 shows a relation between the resistance and the amount of attenuation of a π type constant impedance attenuator.

The variable attenuator 4 shown in FIG. 2 is equivalent to a π type constant impedance attenuator having pin diodes in place of fixed resistances shown in FIG. 9. A constant voltage, e.g., 12 V is applied to an input 213 while a control voltage (Vs) lower than the constant voltage is applied to an input 210. When the control voltage is close to 0 V, no current flows through the pin diode 204, so that the high frequency resistance of the diode 204 is high. In this condition, a great current flows through the pin diodes 206 and 207 with the result that the high frequency resistances of the diodes 206 and 207 are low. At this instant, the amount of attenuation to be effected by the attenuator 4 is great. Conversely, when the control voltage is high, a current flows through the pin diode 204 and lowers the high frequency resistance of the diode 204 while raising the voltage of the resistance 209. As a result, the currents to flow through the pin diodes 206 and 207 decrease while the high frequency resistances of the diodes 206 and 207 increase. A specific relation between the control voltage (Vs) and the amount of attenuation by the attenuator 4 is shown in FIG. 6.

In FIG. 2, the control voltage input 210 is connected to the output of the driver amplifier 11, FIG. 1, at one end and connected to between the capacitor 203 and the pin diode 204 at the other end together with a capacitor 211 and a choke coil 212. In this configuration, the signal S to be transmitted and fed to the input 200 from the buffer amplifier 3, FIG. 1, has its voltage level controlled by the control signal applied to the input 210 from the driver amplifier 11. The controlled voltage is delivered from the attenuator 4 to the amplifier 5, FIG. 1.

The input, or power source input, 213 is connected to the input side of the capacitor 203 and pin diode 206 via a resistor 214.

Figure 4A:
FIGS. 4A–4F are timing charts demonstrating a specific operation of the embodiment.
Figure 4B:
Figure 4C:
Figure 4D:
Figure 4E:
Figure 4F:

The operation of the circuitry shown in FIG. 1 will be described hereinafter. The first time slot S1 to the fourth time slot S4 shown in FIG. 3 are sequentially transmitted in this order, as stated earlier. FIGS. 4A–4F demonstrate a specific procedure in which the level of the signal S in the second time slot S2 is controlled while the transmission of the first time slot S1 is under way. On the transmission of the first time slot S1, the write-in controller 9 calculates a difference between the level of the time slot S2 sent last time and the level of the time slot S2 to be sent next. Then, the controller 9 generates control data based on the difference or deviation and the preselected value assigned to the time slot S2. When the time slot S1 is being sent, the controller 9 writes the control data D in the RAM 8, as shown in FIG. 4C. Immediately before a transmission timing signal meant for the second time slot S2, FIG. 4B, arrives at the input terminal 7, the control data D for the time slot S2 is read out of the RAM 8 under the control of the controller 9 and fed to the DAC 10, as shown in FIG. 4D. The DAC 10 latches the control data D, as shown in FIG. 4E. On the arrival of the timing signal meant for the time slot S2 at the input terminal 7, the DAC 10 converts the control data D to analog control data D and delivers it to the driver amplifier 11, as shown in FIG. 4F.

In parallel with the above procedure, a baseband signal for the time slot S2 is applied to the input terminal 1 and then modulated by the quadrature modulator 2 to turn out a $\pi/4$ shift QPSK signal S to be transmitted. The modulated signal S is routed through the buffer amplifier 3 to the variable attenuator 4. Then, the driver amplifier 11 drives the attenuator 4 on the basis of the control data D. As a result, the attenuator 4 attenuates the voltage of the input signal S by a controlled amount and delivers the resulting signal S to the amplifier 5. The signal S is amplified by the amplifier 5 and then fed to the output terminal 6 and output level detector 12. The output level detector 12 detects the level of the input signal S and feeds the detected level to the controller 9. In response, the controller 9 determines whether or not the signal S being sent has a desired level. If the result of this decision is negative, the controller again calculates a difference or deviation which will set up the desired level, and writes it in the RAM 8 as control data D. Consequently, the attenuator 4 attenuates the voltage of the signal S by an amount corresponding to the new deviation, thereby providing the signal S with the desired level. The signal S with the desired level is fed to the amplifier 5. When the signal S of the second time slot S2 is being transmitted, the control circuit 9 generates control data D for the next or third time slot S3 and writes it in the RAM 8, as shown in FIG. 4C.

The above procedure is repeated for all of the time slots S1–S4. As a result, the transmission output is stably controlled throughout the time slots S1–S4.

In summary, the illustrative embodiment generates, while the transmission of the preceding time slot is under way, the deviation and control data meant for the succeeding time slot, and controls the level at the time when the succeeding time slot is to be sent. It is, therefore, needless to complete the above sequence of steps rapidly in a short period of time. This successfully implements stable transmission output control while reducing the size and power consumption the a radio transmission output control circuit. When the embodiment is applied to a digital cordless telephone or similar portable apparatus, it is capable of controlling its transmission output and transmission output level stably without increasing the size or power consumption.

Various modifications will become possible for those skilled in the art after receiving the teachings of the present disclosure without departing from the scope thereof. For example, while the embodiment writes the control data D meant for the next time slot in the RAM 8 during the course of transmission of the time slot immediately preceding it, the control data D may be written to the RAM 8 during the course of transmission of a more preceding time slot. Use may be made of a temperature sensor such that the control data D to be written to the RAM 8 suffers from a minimum of deviation attributable to temperature. To correct the control data, a correction value may be directly calculated or otherwise produced from the previously stated deviation, instead of the increment or decrement by the predetermined value $\Delta$.

What is claimed is:

1. A radio transmission output control circuit comprising:

modulating means for modulating signals to be sequentially transmitted in consecutive time slots at predetermined timings;

control data generating means for generating, when one of the consecutive time slots is being transmitted, control data for controlling an output level of a subsequent time slot, and for outputting said control data in response to a transmission timing assigned to said subsequent time slot, said control data being generated and output prior to the start of said subsequent time slot; and level control means for controlling said output level of said subsequent time slot on the basis of said control data.

2. A circuit as claimed in claim 1, wherein said modulating means comprises a quadrature modulator for modulating a baseband signal to a $\pi/4$ shift QPSK signal to be transmitted.

3. A circuit as claimed in claim 1, further comprising level detecting means for detecting a level of the time slot currently in transmission, and for outputting a detected level signal.

4. A circuit as claimed in claim 1, wherein said control data generating means comprises:

comparing means for comparing said detected level signal with a desired level preselected for the time slot currently in transmission; and level adjusting means for adjusting, based on a result of comparison by said comparing means, said control data meant for said subsequent time slot.

5. A circuit as claimed in claim 1, wherein said control data generating means further comprises a memory for storing preselected values respectively corresponding to desired levels assigned to said consecutive time slots.

6. A circuit as claimed in claim 4, further comprising a transmission amplifier for amplifying a signal to be transmitted and controlled by said level adjusting means.

* * * * *

UNITED STATES PATENT AND TRADEMARK OFFICE
CERTIFICATE OF CORRECTION

PATENT NO.   : 5,631,930
DATED        : May 20, 1997
INVENTOR(S)  : Yutaka Sasaki It is certified that error appears in the above-indentified patent and that said Letters Patent is hereby corrected as shown below:

On the Title Page, Section [56], under "U.S. PATENT DOCUMENTS", line 2: "Wilson" should read --Walczak-- and line 4: "5,387,555 2/1995" should read --5,287,555 2/1994--

Column 3, line 50: "A" should read --$\Delta$--

Column 4, line 25: after "hand," insert --a--

Signed and Sealed this

Twenty-eighth Day of April, 1998

BRUCE LEHMAN

*Attest:*

*Attesting Officer*         *Commissioner of Patents and Trademarks*